(12) United States Patent
Hartnett

(10) Patent No.: US 7,590,909 B2
(45) Date of Patent: Sep. 15, 2009

(54) IN-CIRCUIT TESTING SYSTEM AND METHOD

(75) Inventor: Fred Hartnett, Plano, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 668 days.

(21) Appl. No.: 11/210,415

(22) Filed: Aug. 24, 2005

(65) Prior Publication Data

US 2007/0067689 A1    Mar. 22, 2007

(51) Int. Cl.
*G01R 31/28* (2006.01)
(52) U.S. Cl. .................... 714/727; 714/734
(58) Field of Classification Search .......... None
See application file for complete search history.

(56) References Cited

U.S. PATENT DOCUMENTS

| | | | |
|---|---|---|---|
| 5,772,451 A | 6/1998 | Dozier, II et al. | |
| 5,867,507 A | 2/1999 | Beebe et al. | |
| 6,006,343 A | 12/1999 | Whetsel | |
| 6,031,282 A | 2/2000 | Jones et al. | |
| 6,246,245 B1 | 6/2001 | Akram et al. | |
| 6,255,727 B1 | 7/2001 | Khoury | |
| 6,278,284 B1 | 8/2001 | Mori et al. | |
| 6,297,164 B1 | 10/2001 | Khoury et al. | |
| 6,343,940 B1 | 2/2002 | Khoury et al. | |
| 6,356,098 B1 | 3/2002 | Akram et al. | |
| 6,499,124 B1 | 12/2002 | Jacobson | |
| 6,576,485 B2 | 6/2003 | Zhou et al. | |
| 6,579,804 B1 | 6/2003 | Zhou et al. | |
| 6,678,848 B1 | 1/2004 | Chan | |
| 6,972,598 B2 * | 12/2005 | Yoo | 326/95 |
| 7,293,211 B2 * | 11/2007 | Kobayashi | 714/729 |
| 7,305,603 B1 * | 12/2007 | Stenfort | 714/727 |
| 2003/0099097 A1 | 5/2003 | Mok et al. | |
| 2004/0044937 A1 | 3/2004 | Dubey | |

* cited by examiner

*Primary Examiner*—Christine T Tu

(57) ABSTRACT

An in-circuit testing system comprises an integrated circuit having a tri-state control pin used for inducing a tri-state mode in the integrated circuit during a scan test of the integrated circuit for controlling a time period for outputting a value associated with the scan test.

17 Claims, 2 Drawing Sheets

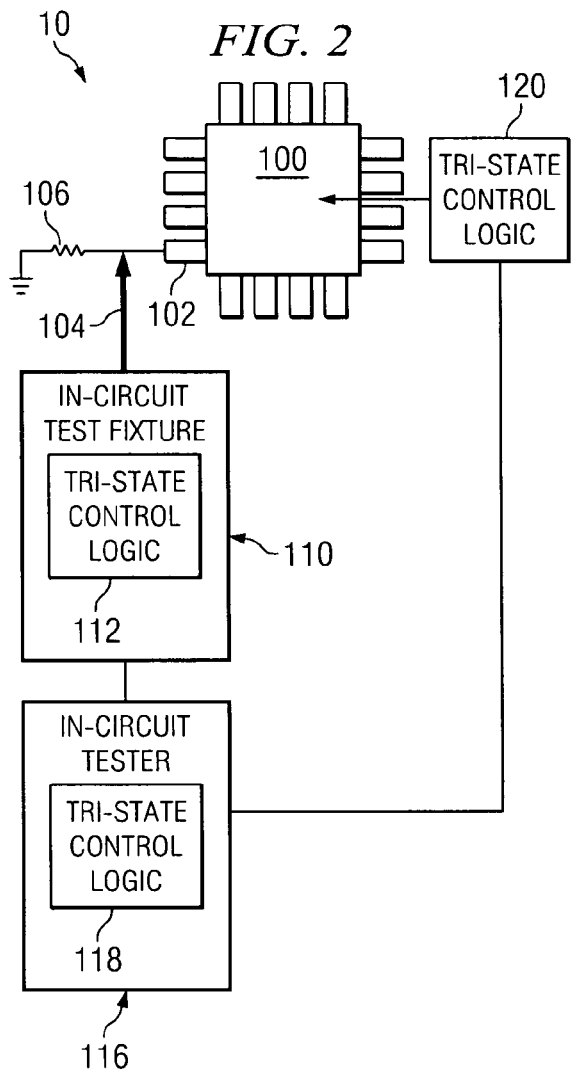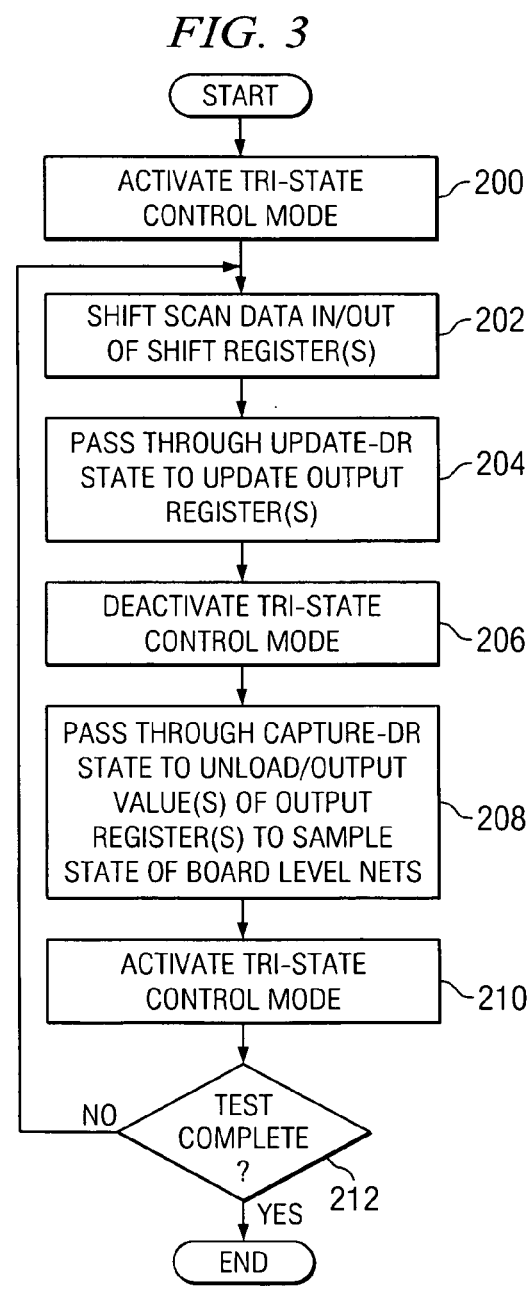

IN-CIRCUIT TESTING SYSTEM AND METHOD

BACKGROUND OF THE INVENTION

In-circuit test probe access to printed circuit assemblies has been significantly reduced based at least in part on shrinking pin pitch on the device package and the use of sockets for second level attachment of the device package to high pin count components. To overcome probe access problems, boundary scan is a technique employed to test a component. However, boundary scan test techniques require power to be applied to the component being tested while testing is in progress. Thus, if there is a short circuit condition associated with the component, short and/or long term reliability of the component is at risk of being compromised. Further, with typical boundary scan rates of 10 MHz-15 MHz, the damaging condition is present on the component for extended periods of time.

BRIEF DESCRIPTION OF THE DRAWINGS

For a more complete understanding of the present invention and the advantages thereof, reference is now made to the following descriptions taken in connection with the accompanying drawings in which:

FIG. 2 is a diagram illustrating another embodiment of an in-circuit testing system in accordance with the present invention; and FIG. 3 is a flow diagram illustrating an in-circuit testing method in accordance with the present invention.

DETAILED DESCRIPTION OF THE DRAWINGS

Figure 1:
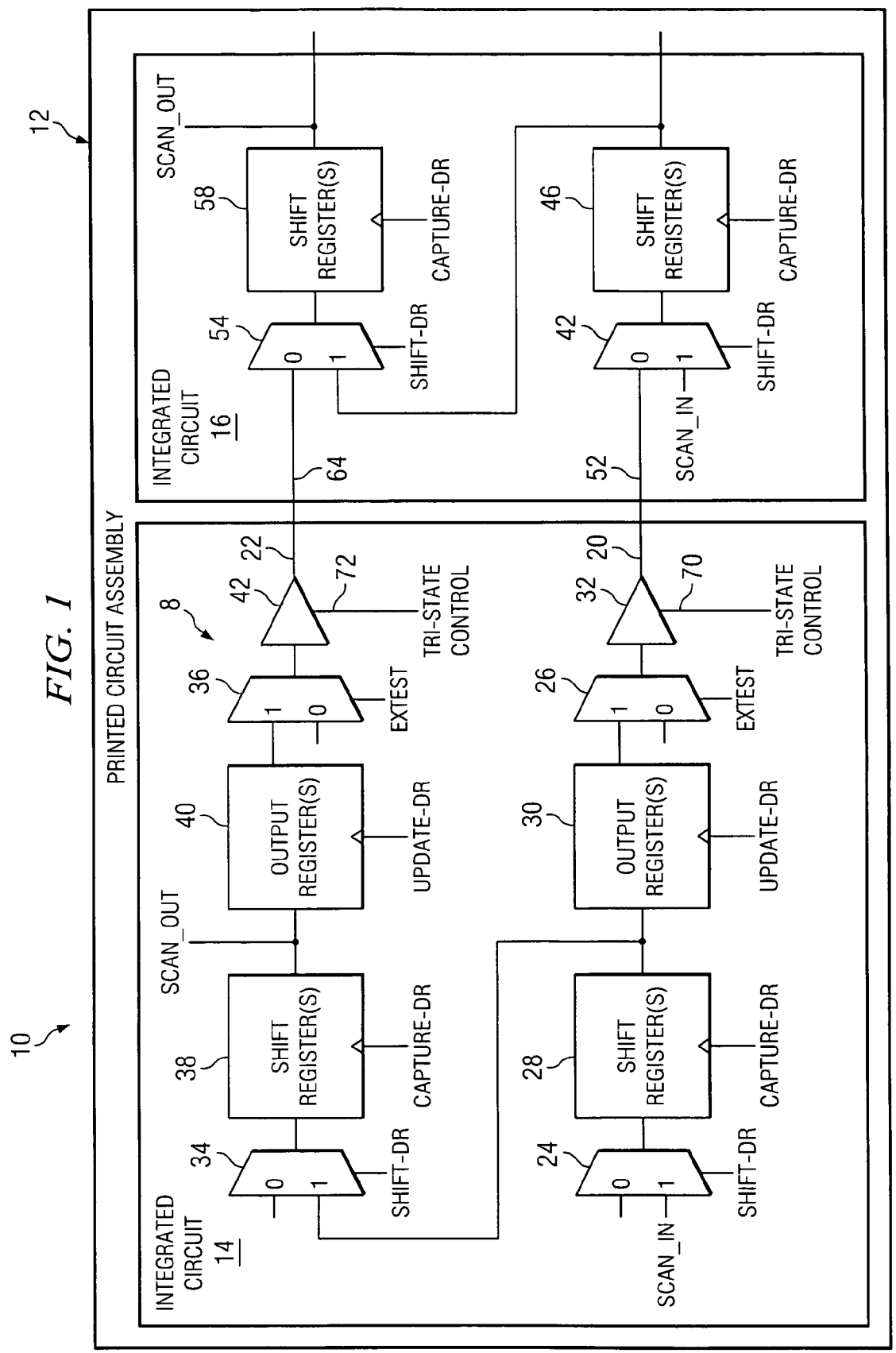
FIG. 1 is a diagram illustrating an embodiment of a boundary scan test circuit of an in-circuit testing system in accordance with the present invention.

The preferred embodiments of the present invention and the advantages thereof are best understood by referring to FIGS. 1-3 of the drawings, like numerals being used for like and corresponding parts of the various drawings.

FIG. 1 is a diagram illustrating a boundary scan test circuit 8 of an in-circuit testing system 10 in accordance with the present invention. In the embodiment illustrated in FIG. 1, system 10 comprises a printed circuit assembly 12 having integrated circuits (ICs) 14 and 16 disposed thereon. However, it should be understood that a greater or fewer quantity of integrated circuits may be disposed on printed circuit assembly 12. FIG. 1 illustrates a simplified implementation of system 10 for a boundary scan circuit 8 having two output pins 20 and 22 of IC 14. However, it should be understood that more complex arrangements may be used with system 10.

In the embodiment illustrated in FIG. 1, IC 14 comprises multiplexers 24 and 26, a shift register(s) 28, an output register(s) 30 and an output driver 32, communicatively coupled together as shown, corresponding to output pin 20, and multiplexers 34 and 36, a shift register(s) 38, an output register(s) 40 and an output driver 42, communicatively coupled together as shown, corresponding to output pin 22. In the embodiment illustrated in FIG. 1, IC 16 comprises a multiplexer 42 and a shift register(s) 46 communicatively coupled together as shown and corresponding to an input pin 52 of IC 16, and a multiplexer 54 and a shift register(s) 58 communicatively coupled together as shown and corresponding to an input pin 64 of IC 16. In the embodiment illustrated in FIG. 1, output pin 20 of IC 14 is communicatively coupled to input pin 52 of IC 16, and output pin 22 of IC 14 is communicatively coupled to input pin 64 of IC 16. Output drivers 32 and 42 operate to increase the strength of signal output by IC 14 (e.g., via pins 20 and 22) to drive the signal(s) across assembly 12 to another component (e.g., IC 16).

In operation, boundary scan data is shifted through registers 28 and 38 of IC 14, and the results are captured by shift registers 46 and 58 of IC 16. For example, in the embodiment illustrated in FIG. 1, multiplexers 24 and 34 enable daisy-chaining of registers 28 and 30 to form a boundary scan chain. FIG. 1 illustrates a simplified example of a boundary scan chain as it should be understood that typical scan chains contain a greater quantity of daisy-chained registers. While in the SHIFT-DR state, the SHIFT-DR signal is true and shift clocks are applied to register(s) 28 and 38 to enable the scan chain to be loaded and unloaded during a boundary scan test. After shifting is complete, the UPDATE-DR state is entered and causes a single UPDATE-DR clock to be applied to output register(s) 30 and 40. After the UPDATE-DR clock occurs, the contents of shift register(s) 28 and 38 are transferred to output register(s) 30 and 40. When the EXTEST instruction is active in tap controller instruction registers (e.g., in a scan tap controller internal to ICs 14 and 16 pursuant to IEEE 1149 standard), the EXTEST signal will be true and the contents of output register(s) 30 and 40 will pass through the multiplexers 26 and 36. The scan tap controller internal to ICs 14 and 16 provides clock inputs and scan control signals to multiplexers 24, 26, 34 and 36 and register(s) 28, 30, 38 and 40. Boundary scan data shifted out of register(s) 38 is indicated by SCAN_OUT in FIG. 1.

In FIG. 1, a simplified embodiment of IC 16 is illustrated having two input pins 52 and 64 for sampling the state of the connection between pins 52 and 64 and respective pins 20 and 22 of IC 14 based on the data that is being driven by IC 14. In the embodiment illustrated in FIG. 1, ICs 14 and 16 are connected together so the outputs of pins 20 and 22 are coupled to the input pins 52 and 64, respectively, of IC 16. For example, during the CAPTURE-DR state of IC 16, registers 46 and 58 are clocked by a single CAPTURE-DR clock in order to sample the state of the connection between pins 52 and 64 with respective pins 20 and 22 to obtain the logic values output from pins 20 and 22. The SCAN_OUT of IC 16 corresponds to the serial data from the sampling of such connections, thereby enabling a comparison between expected output values to actual values sampled by IC 16. For ease of illustration and description, it should be understood that the shifting operation of the components of IC 16 (e.g., registers 46 and 58 and multiplexers 42 and 54 are similar as to described above for IC 14 and in accordance with standard IEEE 1149.

In the embodiment illustrated in FIG. 1, output drivers 32 and 42 each comprise a tri-state control input 70 and 72, respectively, to cause output drivers 32 and 42 to tri-state or "float" (e.g., driving neither a logic "one" nor a logic "zero"). For example, in operation, output drivers 32 and 42 generally drive either a logic "one" or a logic "zero" output (e.g., based on the logic value present at the input of the output driver). Embodiments of the present invention enable tri-state control of output drivers to essentially turn output drivers 32 and 42 "off" such that output drivers 32 and 42 are not driving any output. Thus, in operation, when output drivers 32 and 42 are turned "on" (non-tri-state mode, thereby driving either a logic "one" or a logic "zero"), output drivers 32 and 42 drive values corresponding to the values contained in respective registers 30 and 40, and when output drivers are turned "off" (tri-state mode), output drivers 32 and 42 do not drive any values. In some embodiments of the present invention, tri-state control of output drivers 32 and 42 is accomplished by a tri-state controller located external to IC 14. In other embodiments of the present invention, tri-state control is accomplished by logic contained on or within IC 14 controllable by test equipment, software control or otherwise. Thus, it should be understood that tri-state control may be accomplished using a variety of different methods.

Thus, during a typical scan test operation, output drivers are generally always "on" because outputs corresponding to the output driver pins are being driven out to be captured by another device (e.g., IC 16). However, during a typical scan test operation, a generally large amount of time is spent in the data shift state (e.g., shifting data into and out of the scan chain). Thus, during a typical scan test operation, the data shift state may be maintained for an extended number of clock cycles, thereby resulting in power being supplied across potential short circuit conditions. Embodiments of the present invention enable turning "on" the output drivers 32 and 42 at predetermined times and for predetermined periods of time (e.g., milliseconds instead of many seconds) for capturing a sample of the state of the connection(s) between ICs 14 and 16 using tri-state control. Thus, embodiments of the present invention substantially reduce the amount of time a potential short condition is in a powered state. In some embodiments of the present invention, tri-state control is only used for outputs of IC 14. However, it should be understood that other ICs may be configured having tri-state control.

FIG. 2 is a diagram illustrating an embodiment of system 10 in accordance with the present invention. In the embodiment illustrated in FIG. 2, an integrated circuit (IC) 100 is illustrated having a dedicated tri-state control pin 102 accessible via, for example, a test probe 104 for inducing or otherwise controlling the application of a tri-state mode to IC 100. It should be understood that IC 100 is configured as described above for IC 14. In the embodiment illustrated in FIG. 1, pin 102 is coupled through a resistor 106 to ground. Because of resistor 106, tri-state control pin 102 is essentially at ground (even though there may be micro-amps of current passing through resistor 106). Thus, because of the minimal voltage level on the tri-state control pin 102, a logic "zero" exists on tri-state control pin 102. An in-circuit test fixture 110 having tri-state control logic 112 associated therewith is used to drive a logic "one" on tri-state control pin 102 (e.g., by applying a voltage to overcome resistor 106), thereby causing a tri-state condition as described above. In other embodiments of the present invention, tri-state control pin 102 can be an active low component such that tri-state control pin 102 is pulled to a logic "one" through resistor 106 and driven low by test probe 104 to tri-state IC 14. Thus, it should be understood that tri-state control may be obtained using a variety of methods. In the embodiment illustrated in FIG. 2, in-circuit test fixture 110 is communicatively coupled to an in-circuit tester 116 having tri-state control logic 118 associated therewith for performing and/or otherwise controlling a scan operation on IC 100 and coordinating and/or controlling a tri-state control mode of IC 100. For example, in operation, in-circuit test fixture 110 is used in combination with in-circuit tester 116 to communicate a signal to IC 100 via tri-state control pin 102 to control the time for outputting a value from IC 100 (e.g., output from an output driver) corresponding to a scan test operation. Thus, embodiments of the present invention provide a dedicated tri-state control pin 102 used for controlling and/or otherwise applying a signal to an integrated circuit during a scan test to induce or otherwise apply a tri-state mode to the integrated circuit, thereby controlling a time period for outputting a value associated with the scan test.

In some embodiments of the present invention, IC 100 comprises tri-state control logic 120 disposed therein for controlling application of the tri-state mode during a scan test. For example, in some embodiments of the present invention, logic 120 disposed on or within IC 100, independently or in cooperation with test controller 116, controls the activation and deactivation of a tri-state mode applied to an output driver of IC 100 during a scan test such that output values corresponding to the scan test are output while the tri-state mode is deactivated, thereby controlling the time period for output of such scan test values as described above. Thus, in operation, tri-state control logic 112, 118 and/or 120 monitors the tap state to determine when to apply the tri-state control and/or signal to tri-state output drivers 32 and 42 and controls the duration of the tri-state control to facilitate controlled output of the scan test values from output drivers 32 and 42.

FIG. 3 is a flow diagram illustrating an embodiment of an in-circuit testing method in accordance with the present invention. The method begins at block 200, where tri-state control mode is activated (e.g., using tri-state control to turn output drivers 32 and 42 of IC 14 "off"). At block 202, scan data is shifted into and/or out of shift registers 28 and 38 of IC 14. At block 204, during the UPDATE-DR state, output registers 30 and 40 are updated to capture values corresponding to respective shift registers 28 and 38.

At block 206, tri-state control mode is deactivated such that output drivers 32 and 42 are turned "on" to enable driving of output values therefrom. At block 208, during the CAPTURE-DR state, output values of output drivers 32 and 42 are captured by IC 16 (e.g., via shift registers 46 and 58) to enable sampling of board-level nets or connections (e.g., the nets corresponding to output pins 20 and 22 and input pins 52 and 64, respectively). It should be understood that data is scanned out of IC 16 to facilitate comparison of such values with expected values (e.g., while data is being scanned into IC 14). At block 210, tri-state control mode is activated, thereby turning output drivers 32 and 42 "off." At block 212, a determination is made whether scan testing is complete. If scan testing is not complete, the method proceeds to block 202. If testing is complete, the method ends. It should be understood that in the method depicted in FIG. 3, various data shifting and/or register updating operations relating to IC 16 may be performed separately and/or concurrently with data shifting and/or register updating operations performed by IC 14 (e.g., shifting of data into registers 46 and 58, updating registers 48 and 60 and/or scanning data out of IC 16).

Thus, embodiments of the present invention substantially reduce a time period where a potential short circuit condition experiences an applied power. For example, embodiments of the present invention utilize a tri-state control mode to control the timing and duration of scan testing value outputs, thereby minimizing an applied power level to a potential short circuit condition.

What is claimed is:

1. An in-circuit testing system, comprising:
an integrated circuit having a tri-state control pin used for inducing a tri-state mode in the integrated circuit during a scan test of the integrated circuit, said integrated circuit comprising:
an output driver of the integrated circuit adapted to be placed in the tri-state mode by the tri-state control pin, wherein output modes of the output driver are controlled by turning the output mode of the output driver between on and off at a plurality of predetermined times for predetermined time periods during the scan test to output values associated with the scan test when the output mode of the output driver is turned on.

2. The system of claim 1, further comprising an in-circuit test fixture communicatively coupled to the tri-state control pin for controlling the time period.

3. The system of claim 1, further comprising an in-circuit test fixture adapted to communicate a signal to the tri-state control pin to toggle the output driver of the integrated circuit between on and off output modes.

4. The system of claim 1, further comprising an in-circuit test fixture adapted to communicate a signal to the tri-state control pin to control a duration of the time period.

5. The system of claim 1, further comprising an in-circuit test fixture adapted to monitor a state of the integrated circuit for communicating a signal to the tri-state control pin to control the time period.

6. The system of claim 1, wherein the tri-state control pin comprises a dedicated tri-state control pin used for applying a signal to the integrated circuit during the scan test.

7. An in-circuit testing system, comprising:
an in-circuit test fixture adapted to communicate a signal to an integrated circuit to place the integrated circuit in a tri-state mode during a scan test of the integrated circuit, said integrated circuit comprising:
an output driver of the integrated circuit adapted to be placed in the tri-state mode by the in-circuit test fixture, wherein output modes of the output driver are controlled by turning the output mode of the output driver between on and off at a plurality of predetermined times for predetermined time periods during the scan test to output values associated with the scan test when the output mode of the output driver is turned on.

8. The system of claim 7, wherein the in-circuit test fixture is adapted to monitor a state of the integrated circuit for controlling the time period.

9. The system of claim 7, wherein the in-circuit test fixture is adapted to cooperate with an in-circuit tester to control the time period.

10. An in-circuit testing method, comprising:
shifting scan data into an integrated circuit for a scan test of the integrated circuit;
controlling a tri-state mode of the integrated circuit; and
controlling a tri-state mode applied to an output driver of the integrated circuit, wherein output modes of the output driver are controlled by turning the output mode of the output driver between on and off at a plurality of predetermined times for predetermined time periods during the scan test to output values associated with the scan test when the output mode of the output driver is turned on.

11. The method of claim 10, further comprising communicating a signal to the tri-state control pin of the integrated circuit to control the tri-state mode.

12. The method of claim 10, wherein controlling the tri-state mode comprises deactivating the tri-state mode to output the value.

13. The method of claim 10, wherein controlling the tri-state mode comprises deactivating a tri-state mode applied to the output driver of the integrated circuit to output the value.

14. The method of claim 10, further comprising communicating a signal to a dedicated tri-state control pin of the integrated circuit to control the tri-state mode.

15. An in-circuit testing system, comprising:
an integrated circuit having logic disposed therein, the logic adapted to control application of a tri-state mode to the integrated circuit during a scan test of the integrated circuit, said integrated circuit comprising:
an output driver of the integrated circuit adapted to be placed in the tri-state mode by the logic, wherein output modes of the output driver are controlled by turning the output mode of the output driver between on and off at a plurality of predetermined times for predetermined time periods during the scan test to output values associated with the scan test when the output mode of the output driver is turned on.

16. The system of claim 15, wherein the logic is adapted to deactivate a tri-state mode applied to the output driver of the integrated to output the value.

17. The system of claim 15, wherein the logic is adapted to monitor a state of the integrated circuit for controlling the application of the tri-state mode.

* * * * *